US006784052B2

(12) United States Patent
Schuegraf et al.

(10) Patent No.: US 6,784,052 B2
(45) Date of Patent: Aug. 31, 2004

(54) METHOD OF FORMING A CAPACITOR WITH TWO DIFFUSION BARRIER LAYERS FORMED IN THE SAME STEP

(75) Inventors: Klaus Florian Schuegraf, Aliso Viejo, CA (US); Randhir P. S. Thakur, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/676,498

(22) Filed: Sep. 30, 2003

(65) Prior Publication Data

US 2004/0063296 A1 Apr. 1, 2004

(Under 37 CFR 1.47)

Related U.S. Application Data

(63) Continuation of application No. 10/017,557, filed on Dec. 14, 2001, now Pat. No. 6,645,845, which is a continuation of application No. 09/378,433, filed on Aug. 20, 1999, now Pat. No. 6,333,225.

(51) Int. Cl.[7] .......................................... H01L 21/8242
(52) U.S. Cl. ........................ 438/253; 438/239; 438/241
(58) Field of Search ................................ 438/239, 240, 438/241, 253, 255

(56) References Cited

U.S. PATENT DOCUMENTS

| 4,907,046 A | 3/1990 | Ohji et al. |
| 5,414,655 A | 5/1995 | Ozaki et al. |
| 5,981,369 A | 11/1999 | Yoshida et al. |
| 5,998,251 A | 12/1999 | Wu et al. |
| 6,104,053 A | 8/2000 | Nagai |
| 6,107,139 A | 8/2000 | Tu et al. |
| 6,130,449 A | 10/2000 | Matsuoka |
| 6,281,540 B1 | 8/2001 | Aoki |
| 6,333,225 B1 | 12/2001 | Schuegraf et al. |
| 6,545,357 B2 * | 4/2003 | Chopra ........................ 257/751 |
| 6,638,809 B2 * | 10/2003 | Agarwal ...................... 438/239 |

FOREIGN PATENT DOCUMENTS

EP         0 889 519 A2    1/1999

OTHER PUBLICATIONS

Kwon, K., et al., *Ta205 Capacitors for 1 Gbit DRAM and Beyond*; 1994 IEEE, pp. 34.2.1–34.2.4.

Sun, S., et al., *A New CVD Tungsten Nitride Diffusion Barrier for Cu Interconnection*; 1996 Symposium on VLSI Technology Digest of Technical Papers, pp. 46–47.

* cited by examiner

*Primary Examiner*—Richard Elms
*Assistant Examiner*—Brad Smith
(74) *Attorney, Agent, or Firm*—Wells St. John P.S.

(57) ABSTRACT

The invention includes: forming a capacitor electrode over one region of a substrate; forming a capacitor dielectric layer proximate the electrode; forming a conductive diffusion barrier layer, the conductive diffusion barrier layer being between the electrode and the capacitor dielectric layer; forming a conductive plug over another region of the substrate, the conductive plug comprising a same material as the conductive diffusion barrier layer; and at least a portion of the conductive plug being formed simultaneously with the conductive diffusion barrier layer.

15 Claims, 16 Drawing Sheets

METHOD OF FORMING A CAPACITOR WITH TWO DIFFUSION BARRIER LAYERS FORMED IN THE SAME STEP

RELATED PATENT DATA

This patent resulted from a continuation of U.S. patent application Ser. No. 10/017,557, filed on Dec. 14, 2001, now U.S. Pat. No. 6,645,845 which in turn is a continuation of U.S. patent application Ser. No. 09/378,433, filed on Aug. 20, 1999 and now U.S. Pat. No. 6,333,225.

TECHNICAL FIELD

This invention pertains to semiconductive processing methods of forming integrated circuitry, as well as to semiconductive device circuitry.

BACKGROUND OF THE INVENTION

A common method of forming memory devices is to form an array of devices (a so-called memory array), and to form control devices at a periphery of the array. The memory array can comprise, for example, a dynamic random access memory (DRAM) array comprising arrays of capacitors and transistors. The peripheral circuitry can comprise, for example, transistors. Frequently, the memory array circuitry and the peripheral circuitry will be covered by insulative materials. Conductive contact plugs can be formed to extend through the insulative materials to electrically connect peripheral circuitry and memory array circuitry to one another, or to other circuitry.

A continuing goal in semiconductor device fabrication is to minimize process steps. Accordingly, it would be desired to develop processing methods which reduce processing steps associated with forming memory array circuitry and peripheral circuitry.

SUMMARY OF THE INVENTION

In one aspect, the invention encompasses a method of forming circuitry. A capacitor electrode is formed over one region of a substrate and a conductive diffusion barrier layer is formed proximate the electrode. A dielectric layer is formed. The diffusion barrier layer is between the electrode and the dielectric layer. A conductive plug is formed over another region of the substrate. The conductive plug comprises a same material as the conductive diffusion barrier layer and at least a portion of the conductive plug is formed simultaneously with the conductive diffusion barrier layer.

In another aspect, the invention encompasses an integrated circuit comprising a capacitor and a conductive plug wherein the conductive plug and capacitor include a common and continuous layer.

In yet another aspect, the invention encompasses a circuit construction. The circuit construction includes a substrate having a memory array region and a region that is peripheral to the memory array region. The circuit construction also includes a capacitor construction over the memory array region of the substrate. The capacitor construction comprises a storage node, a dielectric layer and a cell plate layer. The dielectric layer is between the storage node and the cell plate layer. The circuit construction further includes an electrical interconnect over the peripheral region. The interconnect is electrically connected to the cell plate layer and extends between the cell plate layer and the substrate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In one aspect, the present invention encompasses a recognition that processing steps associated with the formation of circuitry over a memory array region of a semiconductive wafer substrate can be consolidated with processing steps associated with formation of circuitry over a peripheral region of the substrate. Such will become more apparent with reference to FIGS. 1–6, which illustrate initial processing of a method of the present invention.

Figure 1:
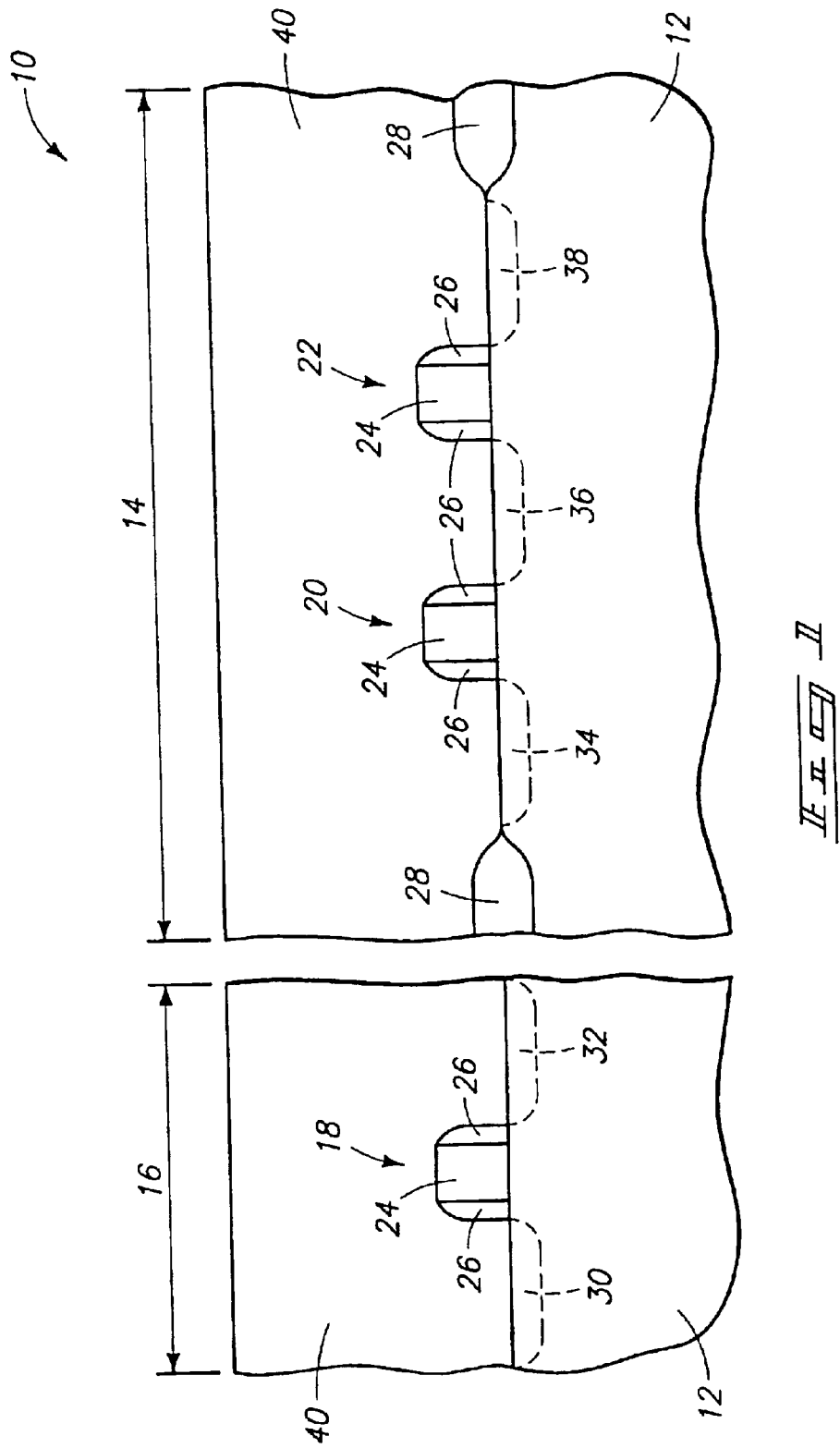
FIG. 1 is a fragmentary, diagrammatic, cross-sectional view of a semiconductive wafer fragment at a preliminary processing step of a method of the present invention.

Referring initially to FIG. 1, a semiconductor wafer fragment 10 comprises a semiconductive substrate 12. Substrate 12 can comprise, for example, a monocrystalline silicon wafer lightly doped (i.e., doped to a concentration of less than or equal to about $10^{16}$ atoms/cm$^3$) with a p-type dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Semiconductive substrate 12 comprises a memory array region 14 and a peripheral region 16.

Word lines 18, 20 and 22 are formed over substrate 12. Word lines 18, 20 and 22 comprise a gate stack 24 and sidewall spacers 26. Gate stack 24 can comprise, for example, layers of silicon dioxide, polysilicon and silicide. Sidewall spacers 26 can comprise, for example, silicon nitride or silicon oxide.

Field oxide regions 28 are formed over substrate 12 within memory array region 14. Field oxide regions 28 can comprise, for example, silicon dioxide.

Electrical nodes 30 and 32 are defined adjacent word line 18, and electrical nodes 34, 36 and 38 are defined adjacent word lines 20 and 22. Wordlines 18, 20 and 22 can comprise transistors, and nodes 30, 32, 34, 36 and 38 can comprise source/drain regions of such transistors. Nodes 30 and 32 are proximate peripheral region 16 of substrate 12. The term "proximate" indicates that nodes 30 and 32 can be within, above or below peripheral region 16 of substrate 12 (embodiments in which nodes are elevationally displaced from substrate 12 are not shown). Similarly, nodes 34, 36 and 38 are proximate memory array region 14 of substrate 12. Nodes 30, 32, 34, 36 and 38 can comprise, for example, conductive diffusion regions formed within substrate 12. Such diffusion regions can be formed by, for example, implanting conductivity-enhancing dopant into substrate 12.

An electrically insulative layer 40 is formed over substrate 12, and over word lines 18, 20 and 22. Insulative layer 40 can comprise, for example, borophosphosilicate glass (BPSG), and can be formed by, for example, chemical vapor deposition.

Figure 2:
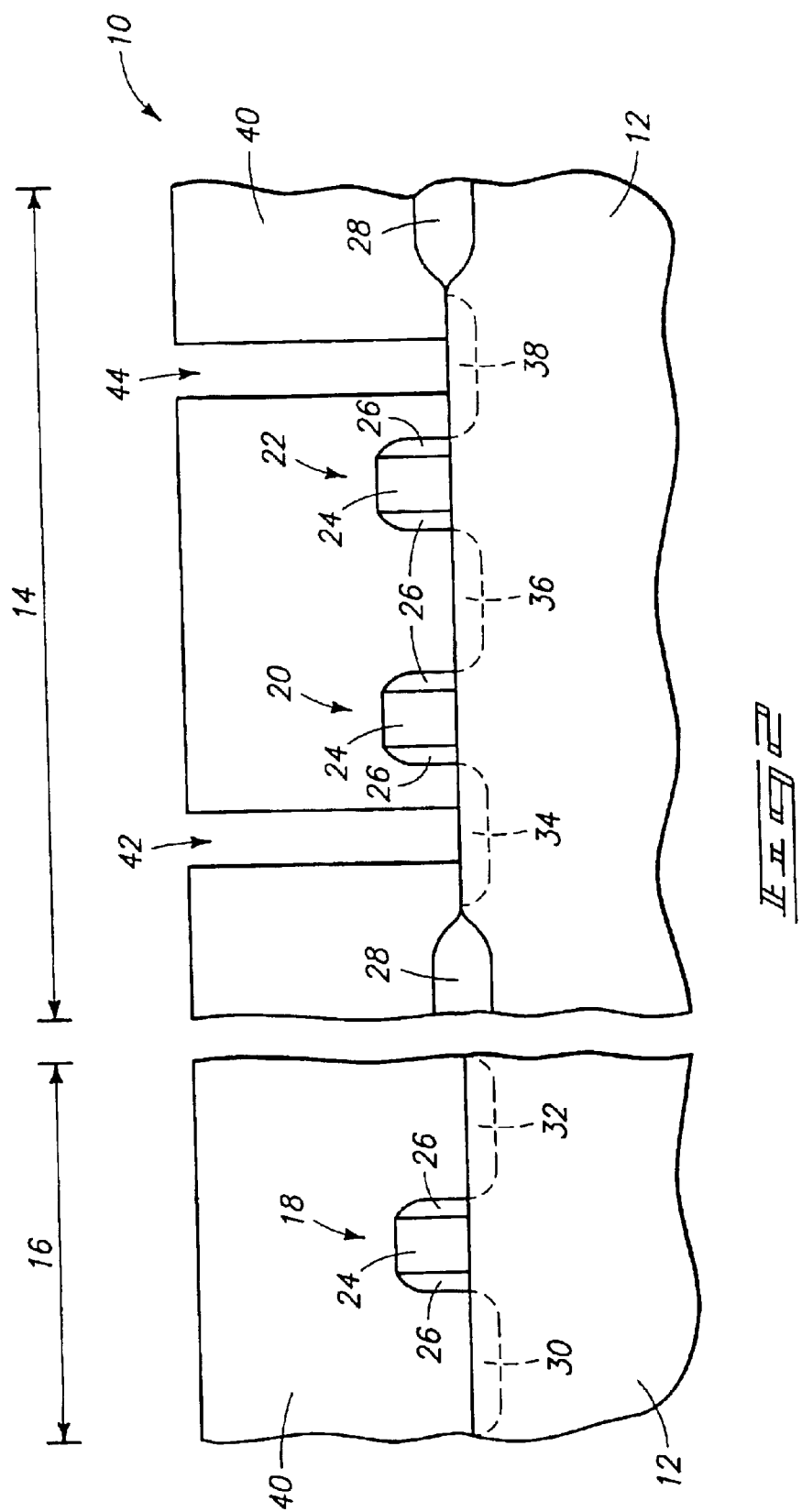
FIG. 2 is a view of the FIG. 1 wafer fragment shown at a processing step subsequent to that of FIG. 1.

Referring to FIG. 2, openings 42 and 44 are etched through insulative layer 40 to nodes 34 and 38, respectively. Openings 42 and 44 can be formed by, for example, providing a photoresist mask (not shown) over layer 40, and patterning the mask to expose regions of insulative layer 40 at opening locations 42 and 44. Insulative layer 40 can then be etched with, for example, a fluorine-containing plasma to form openings 42 and 44. The photoresist mask can be subsequently removed to leave the structure shown in FIG. 2.

Figure 3:
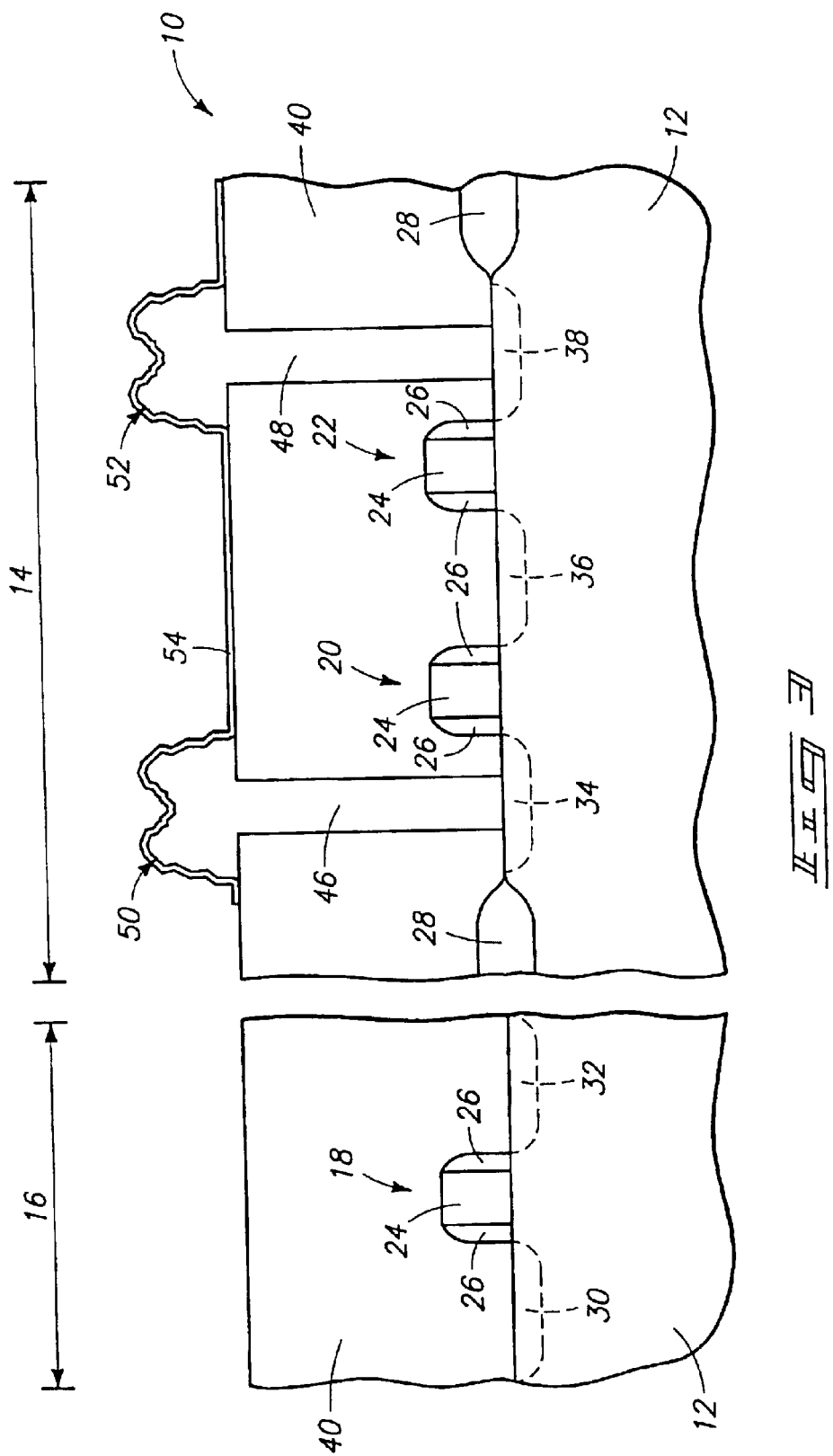
FIG. 3 is a view of the FIG. 1 wafer fragment shown at a processing step subsequent to that of FIG. 2.

Referring to FIG. 3, capacitor storage nodes 46 and 48 are formed within openings 42 and 44 (FIG. 2), respectively. Capacitor storage nodes 46 and 48 can comprise, for example, polysilicon and preferably comprise the shown roughened outer surfaces 50 and 52. Such roughened outer surfaces can be formed by, for example, deposition of hemispherical grain polysilicon.

A dielectric layer 54 is formed over storage nodes 46 and 48. Dielectric layer 54 can comprise, for example, one or more of silicon dioxide or silicon nitride, and preferably comprises tantalum oxide. Dielectric layer 54 can be formed by, for example, chemical vapor deposition. Storage nodes 46 and 48, and dielectric layer 54, can be formed by methods known to persons of ordinary skill in the art, such as, for example, chemical vapor deposition. In the shown embodiment, the material of storage nodes 46 and dielectric layer 54 does not extend over peripheral region 16. Such can be accomplished by, for example, masking peripheral region 16 while forming nodes 46 and 48, and while forming dielectric layer 54.

Figure 4:
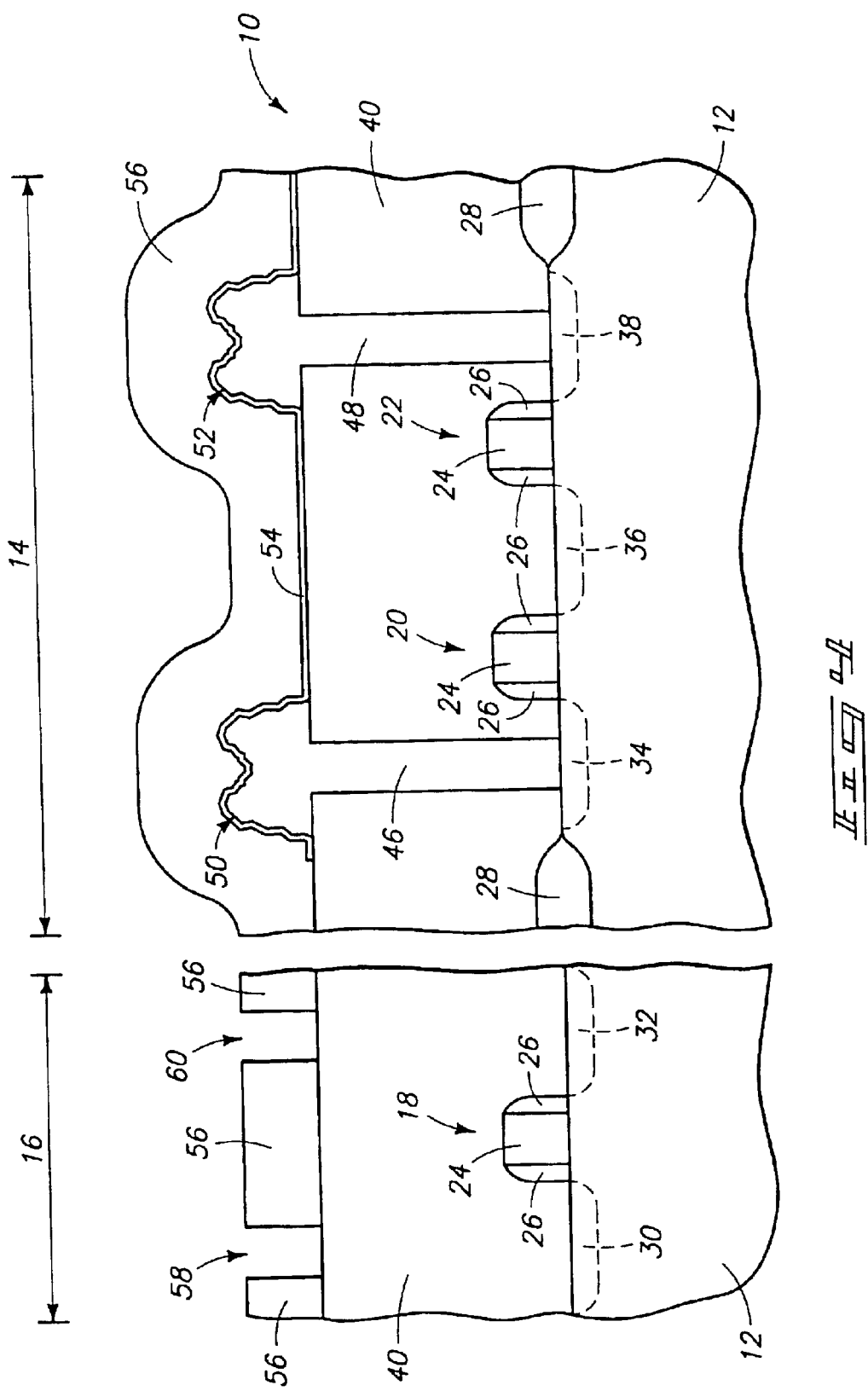
FIG. 4 is a view of the FIG. 1 wafer fragment shown at a processing step subsequent to that of FIG. 3.

Referring to FIG. 4, a photoresist masking layer 56 is provided over regions 14 and 16 of substrate 12 and patterned to define openings 58 and 60 in peripheral region 16.

Figure 5:
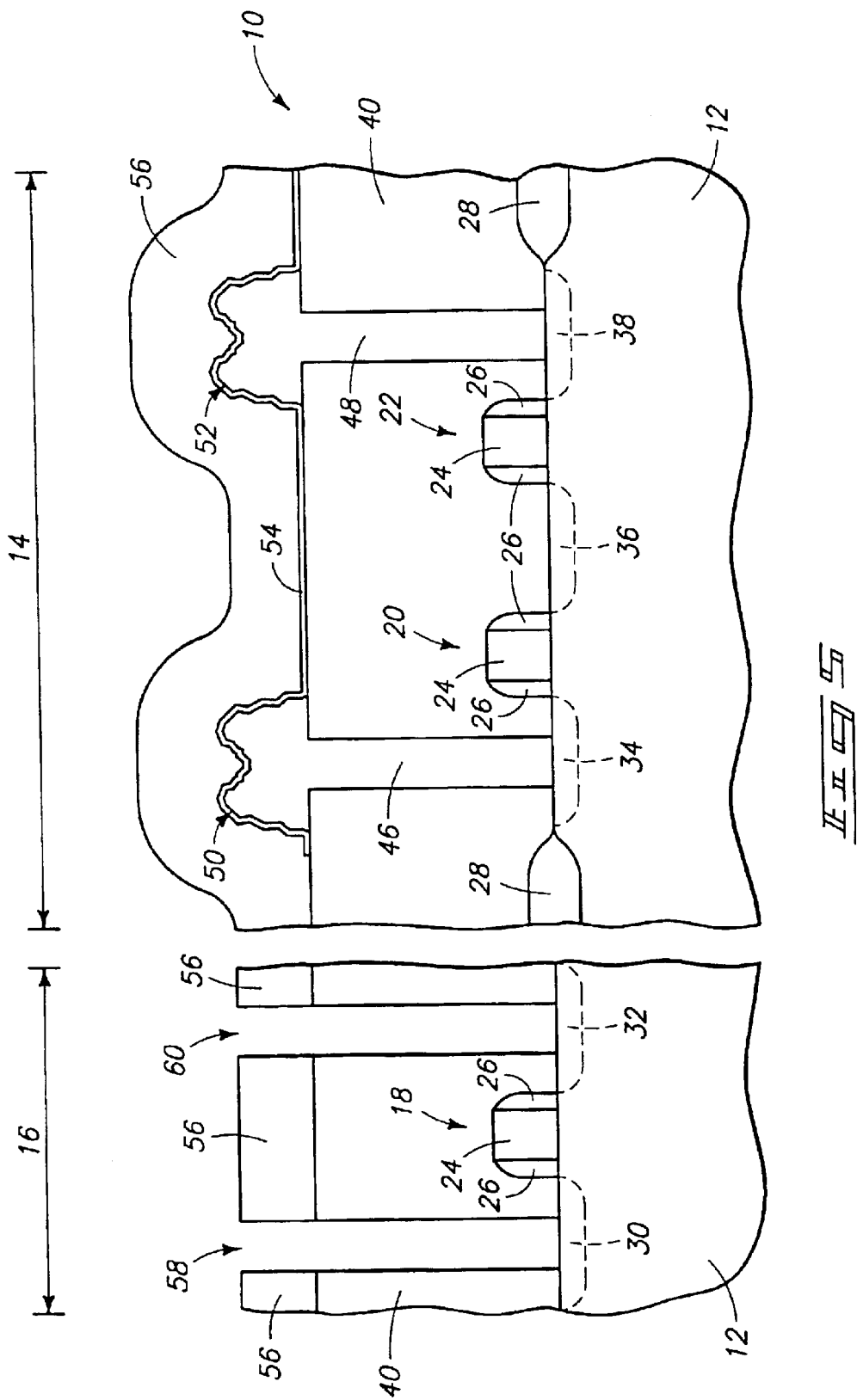
FIG. 5 is a view of the FIG. 1 wafer fragment shown at a processing step subsequent to that of FIG. 4.

Referring to FIG. 5, openings 58 and 60 are extended to node locations 30 and 32, respectively. Openings 58 and 60 can be extended by, for example, a plasma etch utilizing a fluorine-containing component.

Figure 6:
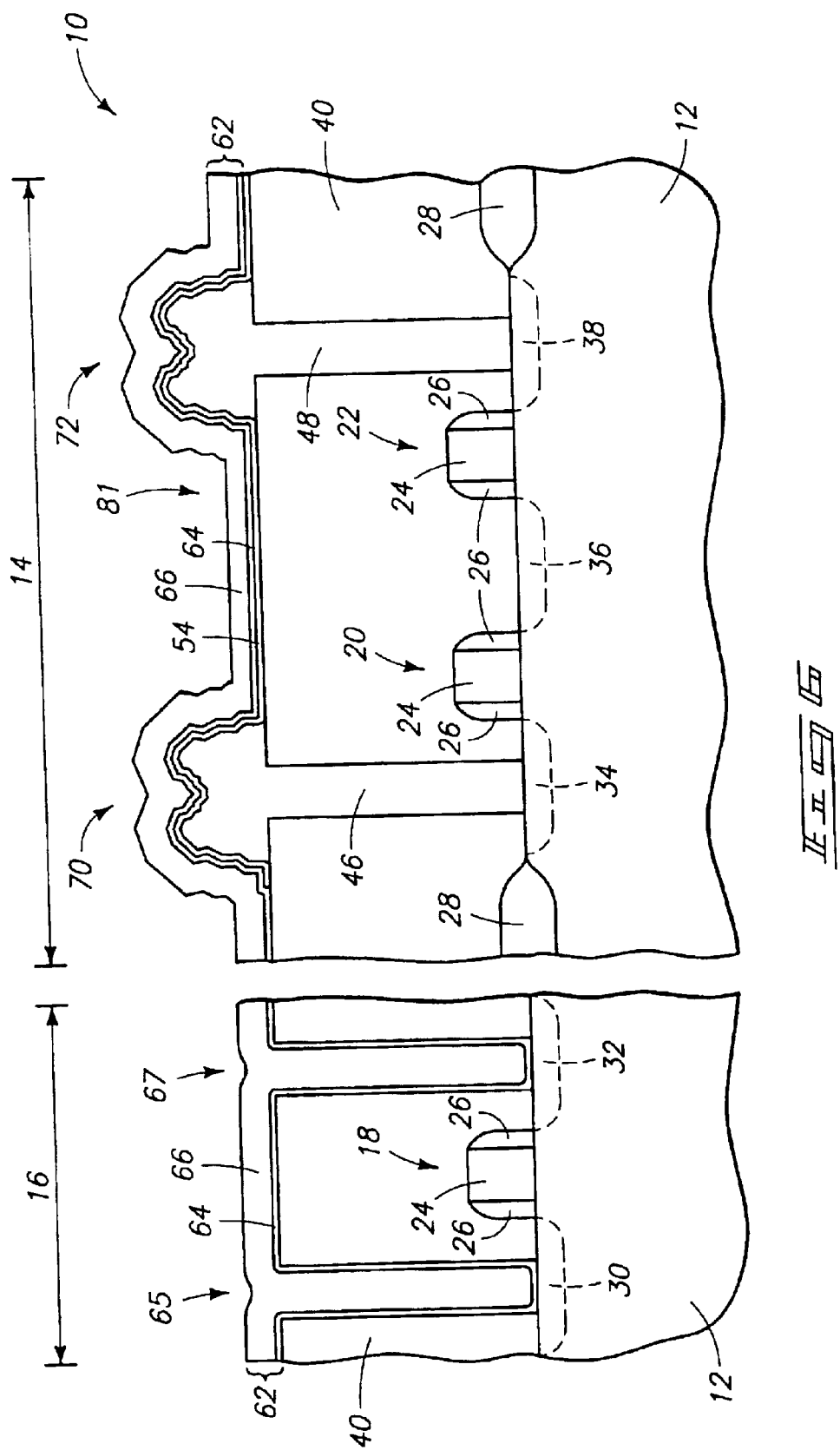
FIG. 6 is a view of the FIG. 1 wafer fragment shown at a processing step subsequent to that of FIG. 5.

Referring to FIG. 6, photoresist material 56 (FIG. 5) is removed. Subsequently, a conductive material 62 is formed over both peripheral region 16 and memory array region 14 of substrate 12. In the shown embodiment, conductive material 62 comprises two separate layers (64 and 66). Layer 64 can comprise, for example, a metal nitride, such as titanium nitride or tungsten nitride, and layer 66 could comprise a metal such as tungsten, aluminum or copper. The metal of layer 66 can be in either an elemental form, or in the form of an alloy, such as aluminum/copper. Layers 64 and 66 can be formed by, for example, chemical vapor deposition and/or sputter deposition.

Layers 64 and 66 would typically have different functional purposes at peripheral region 16 relative to memory array region 14. Specifically, layers 64 and 66 form contact plugs 65 and 67 at peripheral region 16, with layer 64 preferably comprising a metal nitride and functioning as an adhesive layer for adhering metal layer 66 within openings 58 and 60 (FIG. 5). Layer 64 can also function to prevent diffusion of dopant from diffusion regions 30 and 32 into metal layer 66. In contrast, layers 64 and 66 form at least a portion of a capacitor electrode 81 over memory array region 14. Specifically, layers 64 and 66 together define at least a portion of capacitor cell plate 81, with conductive material 62 and dielectric layer 54 being operatively adjacent storage node layers 46 and 48 to form capacitor structures 70 and 72. In embodiments in which dielectric layer 54 comprises tantalum oxide, layer 64 preferably comprises a metal nitride. Layer 64 can then function as a capacitor diffusion barrier layer to inhibit undesired diffusion of materials between tantalum oxide layer 54 and upper capacitor electrode layer 66.

Although material 62 is shown as comprising two layers, it is to be understood that the invention also encompasses embodiments in which material 62 comprises only one layer, and other embodiments in which material 62 comprises more than two layers. For instance, material 62 can comprise three layers wherein a first layer is titanium deposited to form titanium silicide at the bottoms of openings 58 and 60 (FIG. 5), and the remaining two layers are a metal nitride layer (such as TiN) and a metal layer (such as Al).

In the shown embodiment, conductive material layer 62 is formed over peripheral region 16 and memory array region 14 in a common deposition step. Thus, such embodiment consolidates formation of conductive contact plugs 65 and 67 with formation of capacitor electrode 81 over memory array region 14. Such can save process steps relative to prior art methods which form conductive contacts over a peripheral region of a substrate separately from formation of a capacitor electrode over a memory array region of the substrate.

Figure 7:
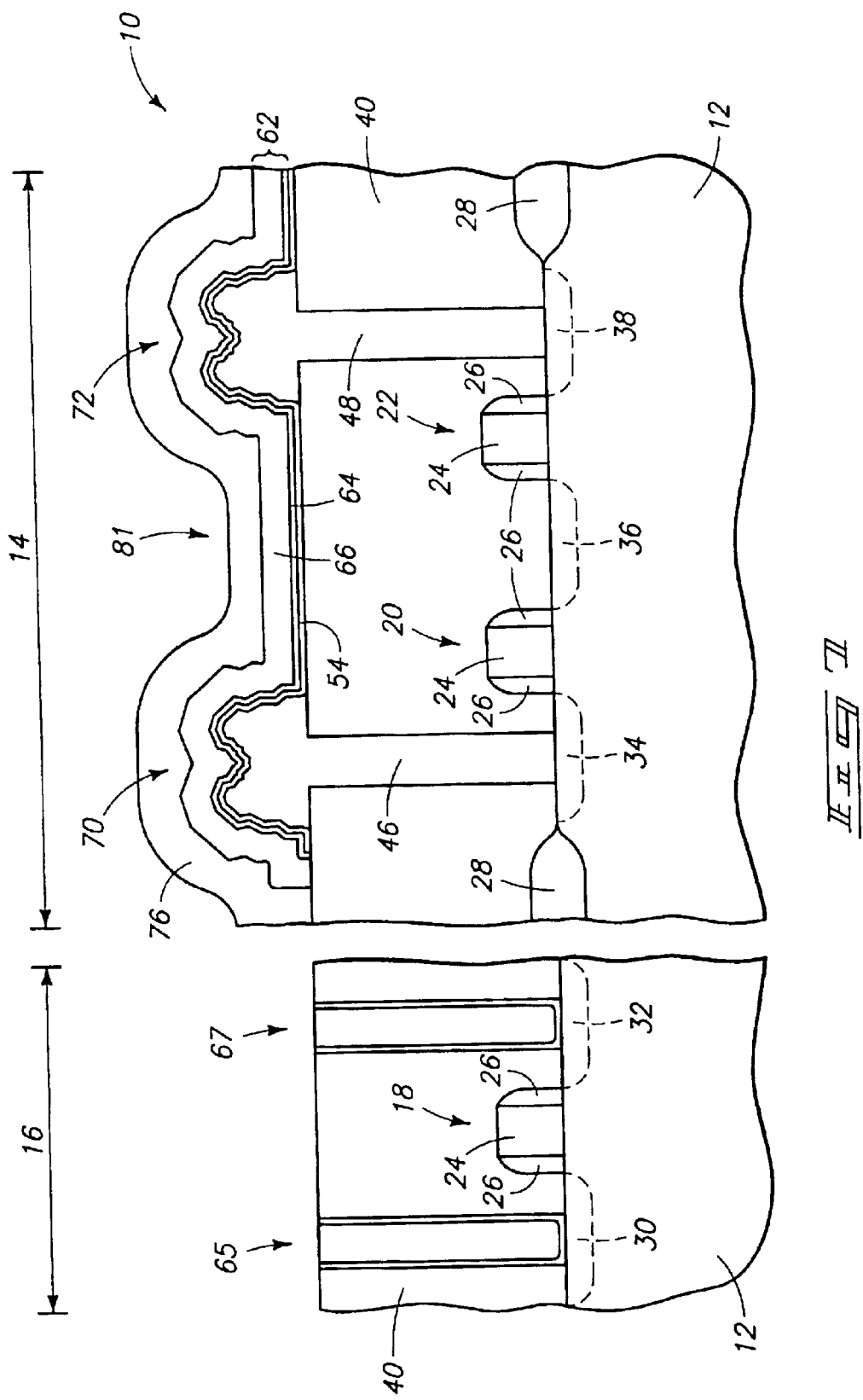
FIG. 7 is a view of the FIG. 1 wafer fragment shown at a processing step subsequent to that of FIG. 6.
Figure 8:
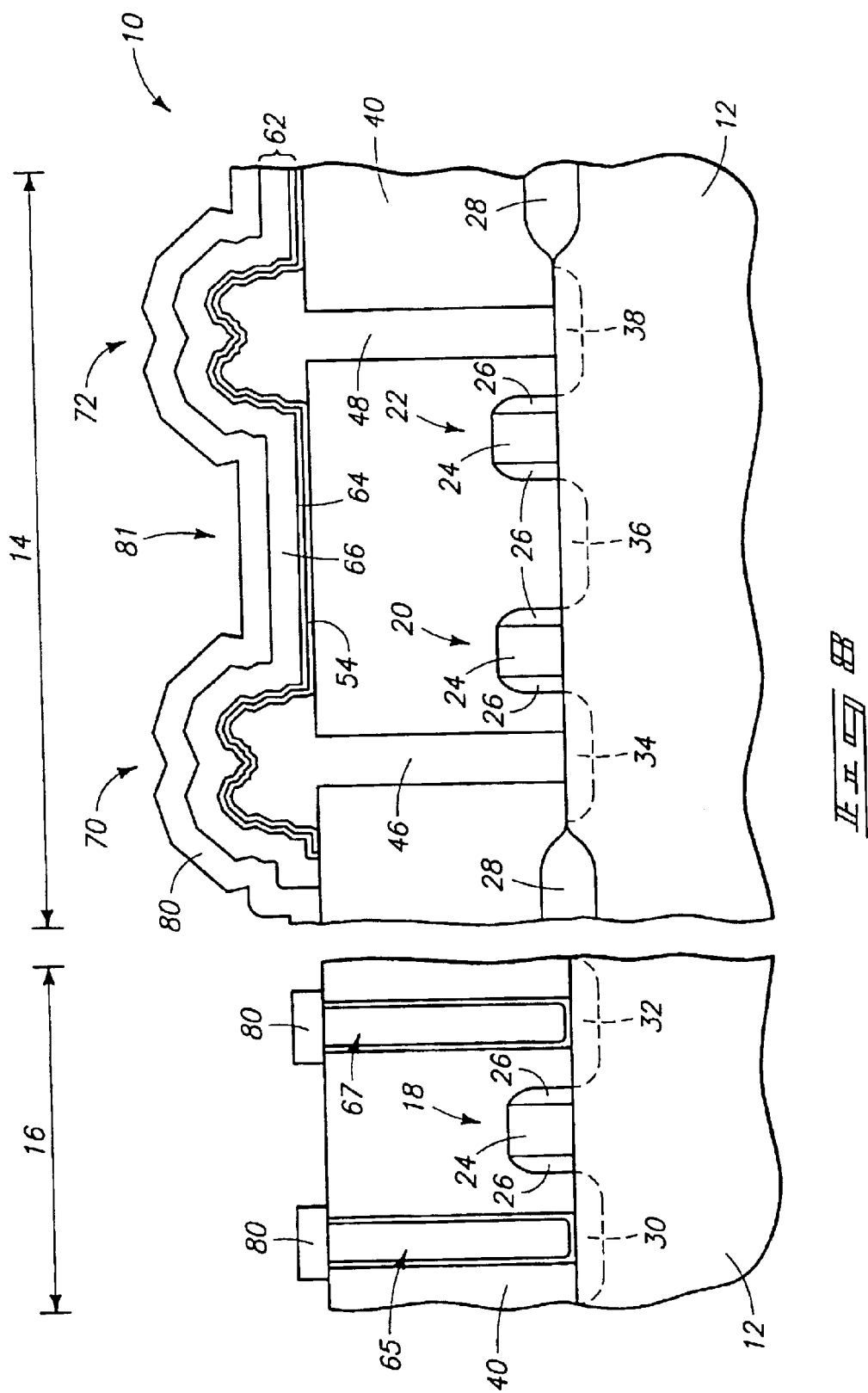
FIG. 8 is a view of the FIG. 1 wafer fragment shown at a processing step subsequent to that of FIG. 7.
Figure 9:
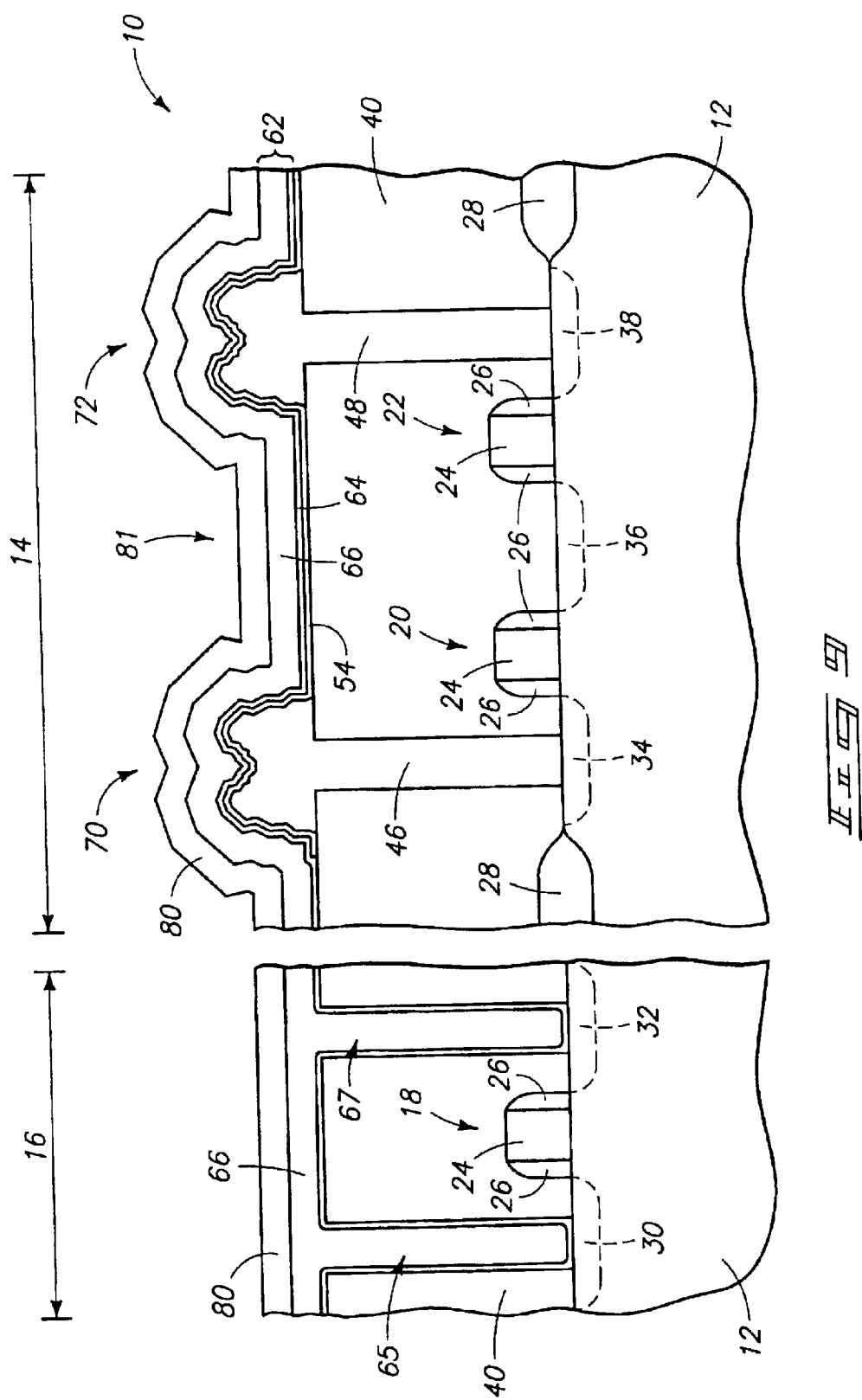
FIG. 9 is a view of the FIG. 1 wafer fragment shown at a step subsequent to that of FIG. 6 in accordance with a second embodiment method of the present invention.
Figure 10:
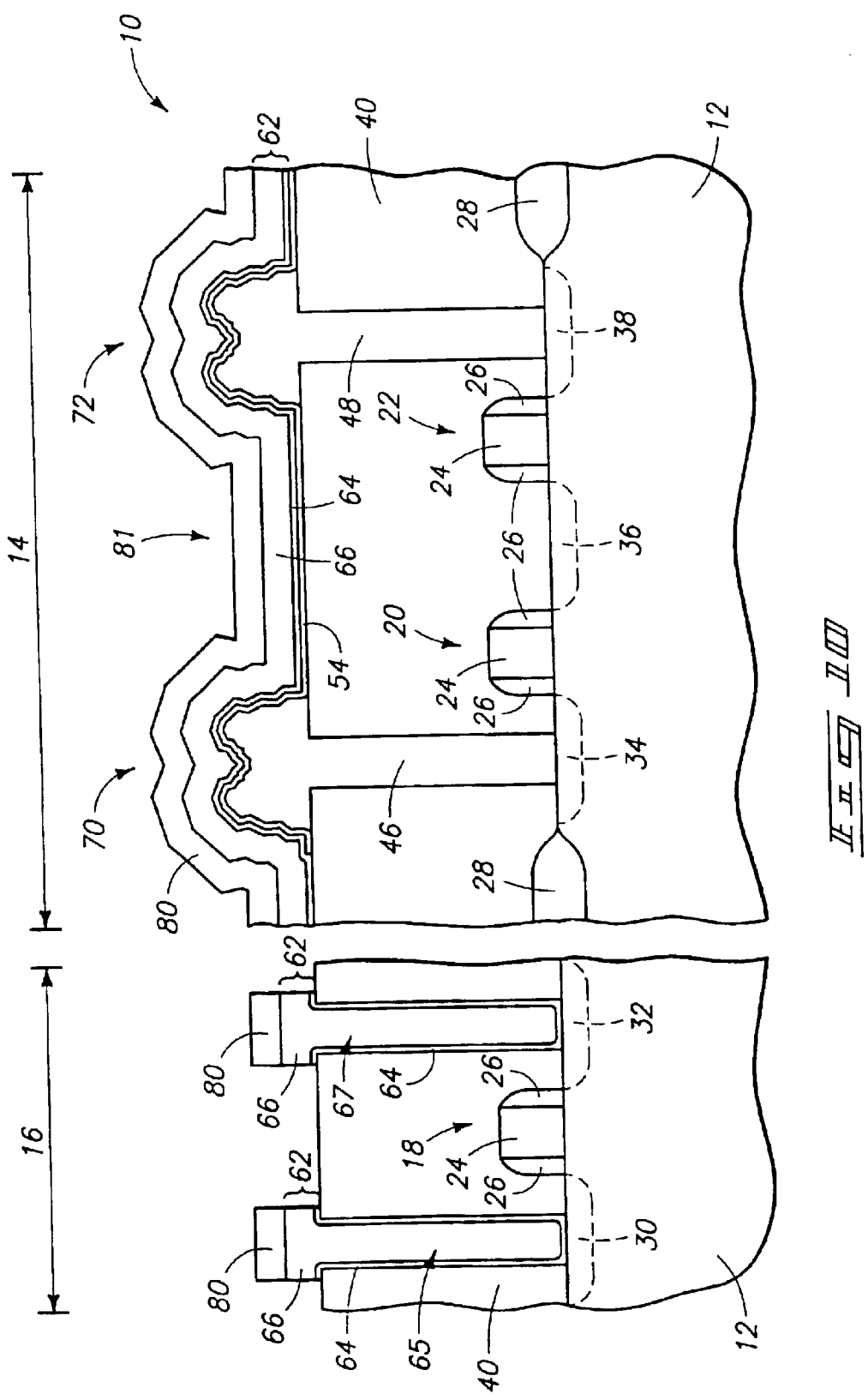
FIG. 10 is a view of the FIG. 9 wafer fragment shown at a step subsequent to that of FIG. 9.

FIGS. 7–10 illustrate alternative processing methods which can be utilized for patterning conductive material at peripheral region 16. FIGS. 7–8 illustrate a first embodiment method, and FIGS. 9–10 illustrate a second embodiment method. Referring first to the embodiment of FIGS. 7 and 8, and specifically referring first to FIG. 7, a photoresist masking layer 76 is provided over memory array region 14 while leaving peripheral region 16 exposed to an etching process. The etch process removes conductive material 62 from over insulative material 40 at peripheral region 16 to electrically isolate conductive plugs 65 and 67 from one another.

Referring to FIG. 8, a conductive layer 80 is formed over memory array region 14 and peripheral region 16 and patterned to form isolated electrical contacts with conductive plugs 65 and 67, and to form another portion of capacitor electrode 81 for capacitor constructions 70 and 72. More specifically, layer 80 and conductive material 62 together form capacitor electrode 81 for capacitors 70 and 72. Conductive layer 80 can comprise, for example, a metal such as tungsten, titanium, copper and/or aluminum, and can be formed by, for example, sputter deposition. Alternatively, conductive layer 80 can comprise a conductively doped semiconductive material, such as, for example, conductively doped polysilicon. Subsequent processing (not shown) such as provision of an interlevel dielectric or spin-on-glass over one or both of regions 14 and 16, followed by chemical-mechanical planarization can be conducted to form an insulative layer over regions 14 and 16.

Referring to the embodiment of FIGS. 9 and 10, identical numbering to that utilized in describing the embodiment of FIGS. 7 and 8 will be used. A difference between the embodiment of FIGS. 9 and 10 and that of FIGS. 7 and 8 is that in the FIGS. 9 and 10 embodiment conductive material 80 is formed over memory array region 14 and peripheral region 16 prior to etching of conductive material 62.

Referring initially to FIG. 9, conductive layer 80 has been formed over memory array region 14 and peripheral region 16.

Referring to FIG. 10, conductive layer 80 and conductive material 62 are patterned in a common etch to electrically isolate conductive plugs 65 and 67 from one another, and to electrically isolate the circuitry of peripheral region 16 from that of memory array region 14. The patterning of material 62 and layer 80 can comprise, for example, formation of a patterned photoresis: layer (not shown) over layer 80, and subsequent transferring of a pattern from the photoresist layer to underlying layer 80 and conductive material 62 to form the structure shown in FIG. 10. The patterned photoresist layer forms a protective layer over a portion of conductive material 80 that is over storage nodes 46 and 48 that protects such portion of conductive material 80 as another portion of conductive material 80 is removed from over peripheral region 16. The portion of conductive material 80 removed from peripheral region 16 is proximate to where openings 58 and 60 (FIG. 5) were formed.

Another embodiment of the invention is described with reference to FIGS. 11 and 12. In describing to FIGS. 11 and 12, identical numbering to that utilized above in describing FIGS. 1–10 will be used, with differences indicated by different numerals.

Figure 11:
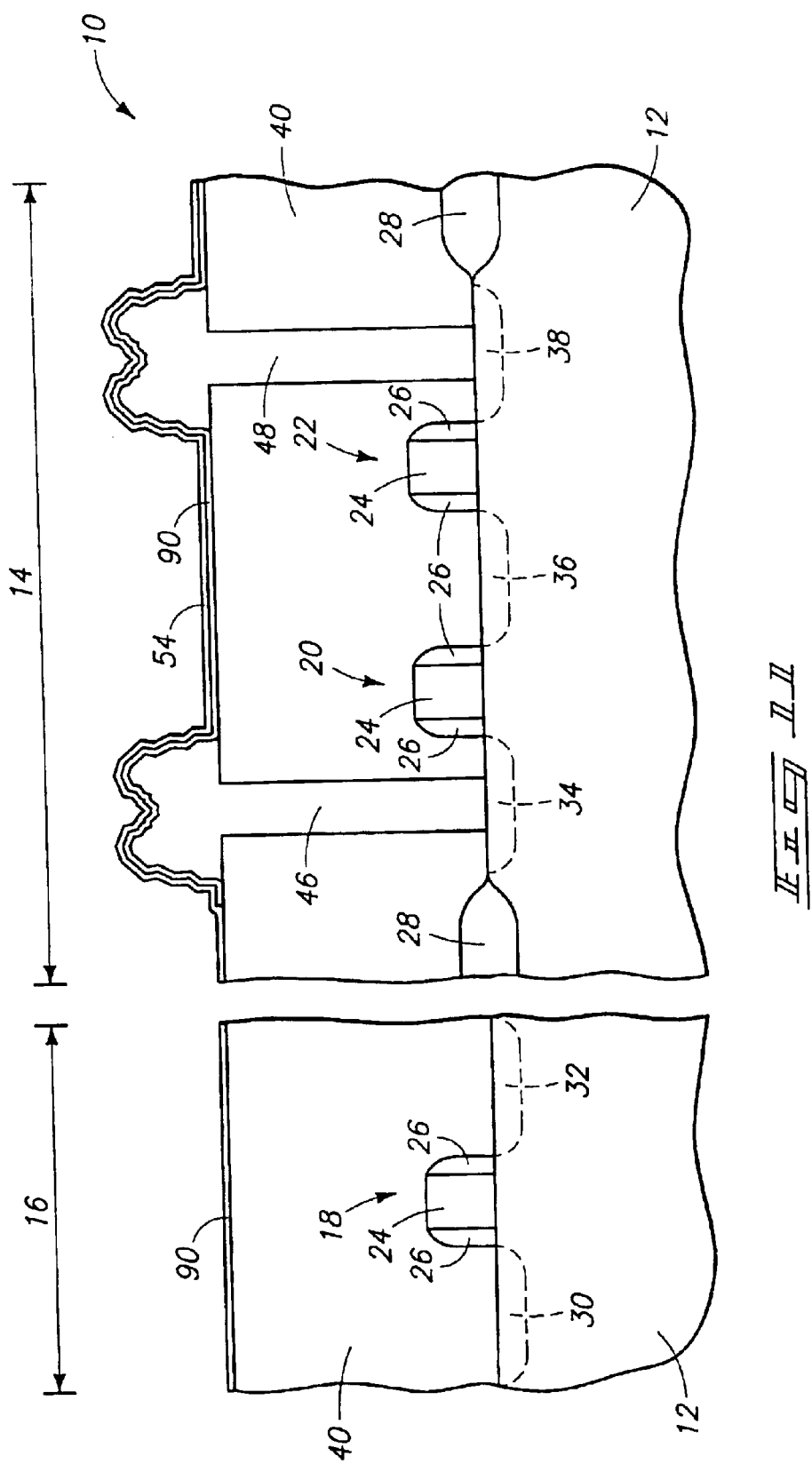
FIG. 11 is a view of the FIG. 1 wafer fragment shown at a step subsequent to that of FIG. 3 in accordance with a third embodiment method of the present invention.

Referring first to FIG. 11, semiconductive wafer fragment 10 is shown at a processing step subsequent to that of FIG. 3, with a layer 90 formed over dielectric layer 54 in memory array region 14, and extending to over peripheral region 16. Layer 90 can comprise, for example, a diffusion barrier layer such as, for example, titanium nitride or tungsten nitride.

Figure 12:
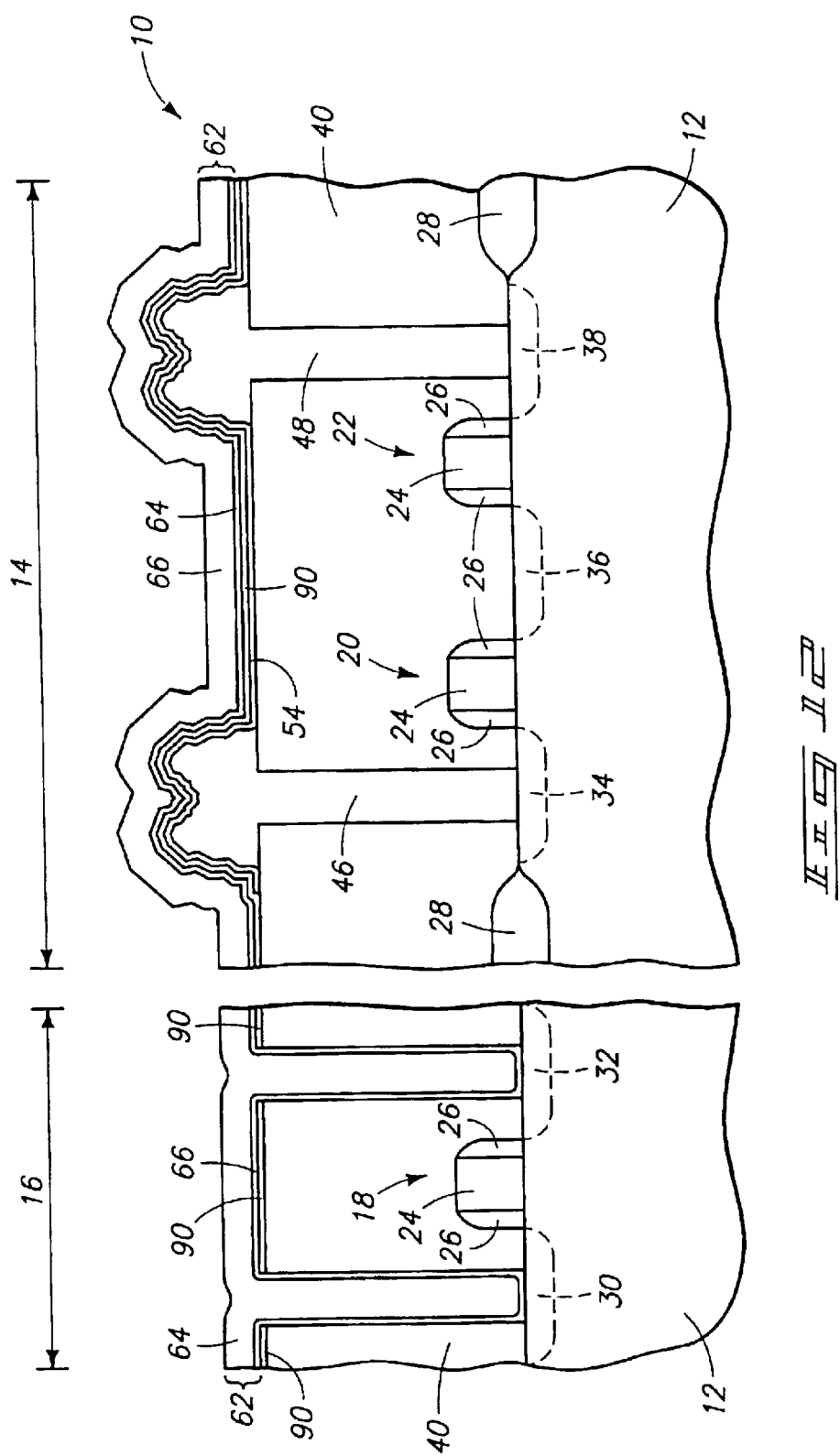
FIG. 12 is a view of the FIG. 11 wafer fragment shown at a processing step subsequent to that of FIG. 11.

Referring to FIG. 12, openings are formed through layer 90 and to node locations 30 and 32, and subsequently filled with conductive material 62. The formation of the openings and subsequent filling of such openings with conductive material 62 can occur through processing similar to that described with reference to FIGS. 4–6. Wafer fragment 10 of FIG. 12 can then be subjected to subsequent processing analogous to that of either the embodiment of FIGS. 7–8 or the embodiment of FIGS. 9–10 to form isolated conductive plugs in electrical contact with node locations 30 and 32, and to form capacitor structures similar to the structures 70 and 72 of FIGS. 8 and 10.

Yet another embodiment of the present invention is described with reference to FIG. 13 which illustrates a semiconductive wafer fragment 10 at a processing step subsequent to that of FIG. 9. In the FIG. 13 embodiment, conductive layer 80 and conductive material 62 are patterned to electrically isolate contact plugs 65 and 67 from one another, but contact plug 67 remains in electrical connection with the upper capacitor electrode 81 over memory array region 14. Thus layers 64 and 66 are common and continuous layers comprised by both contact plug 67 and capacitors 70 and 72. In the FIG. 13 embodiment, contact plug 67 forms an electrical connection between memory array region 14 and electrical node 32.

Figure 13:
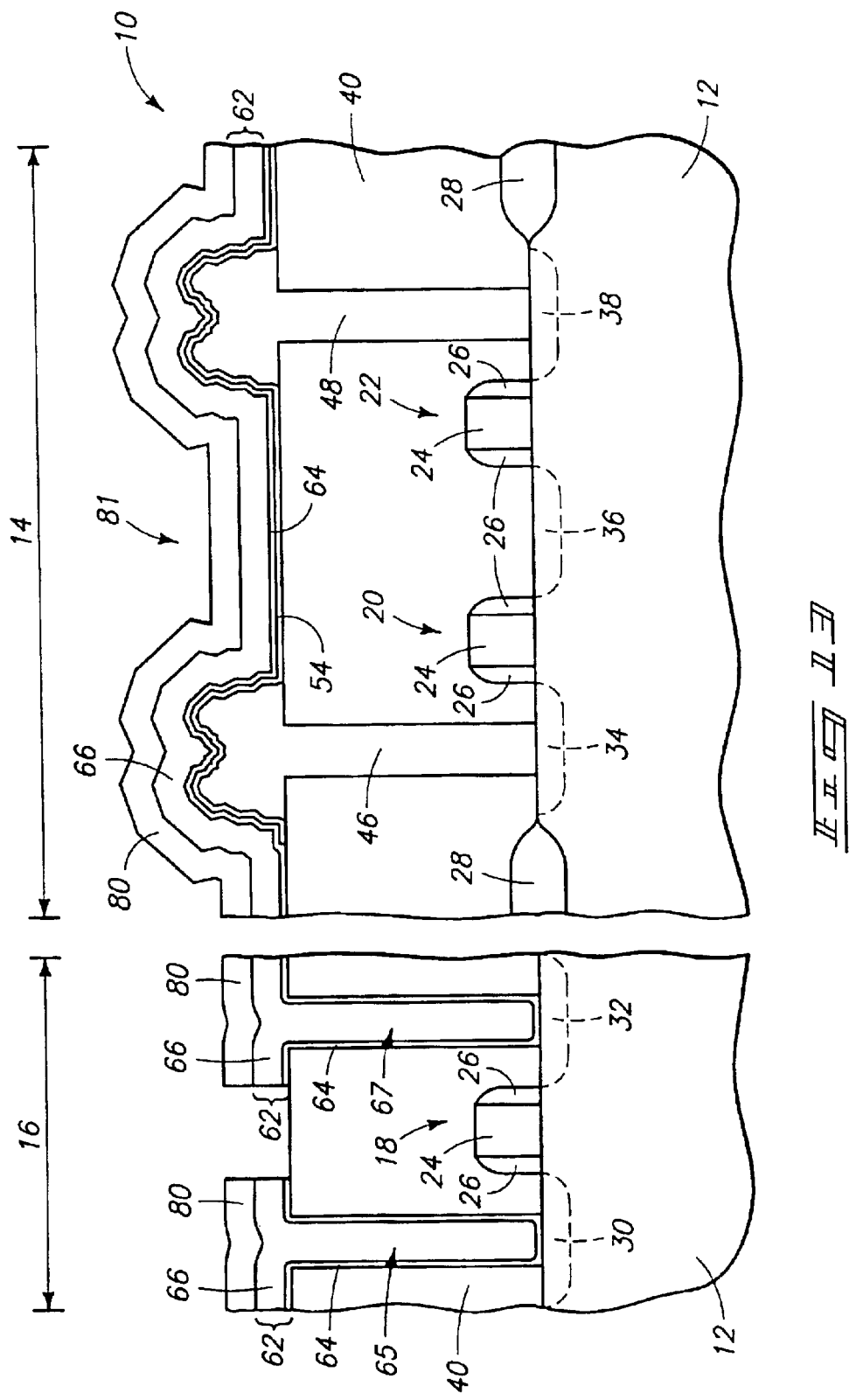
FIG. 13 is a view of the FIG. 1 wafer fragment shown at a processing step subsequent to that of FIG. 6 in accordance with a fourth embodiment method of the present invention.

The embodiment of FIG. 13 can be advantageous over prior art methods for providing a good electrical contact to a cell plate electrode. Specifically, prior art methods utilize electrical connects extending upwardly from a cell plate layer. Such electrical connects are formed by providing an insulative layer over the cell plate layer and etching downwardly through the insulative layer to expose the cell plate layer. Occasionally, the etch extends through the cell plate layer and results in a poor electrical connection to the cell plate layer. In contrast, the embodiment of FIG. 13 utilizes an electrical connection extending downwardly from a cell plate layer and formed during formation of the cell plate layer. Specifically, at least a portion of the cell plate layer 81 is preferably formed over electrical interconnect 67 during formation of electrical interconnect 67.

It is noted that the invention also encompasses embodiments wherein cell plate layer 81 from memory array region 14 extends to physically contact more than one contact plug in peripheral region 16. Such embodiments can provide redundancy in the event that one or more of the connections fails. In the shown embodiment, interconnects 65 and 67 are connected through a switch comprising word line 18. Interconnect 65 can then be connected to other circuitry (not shown) to provide a switchable connection between such other circuitry and the capacitor plate 81 over memory region 14.

Yet another embodiment of the present invention is described with reference to FIGS. 14–16. In describing the embodiment of FIGS. 14–16, identical numbering to that utilized above in describing the embodiments of FIGS. 1–13 will be used, with differences indicated by different numerals.

Figure 14:
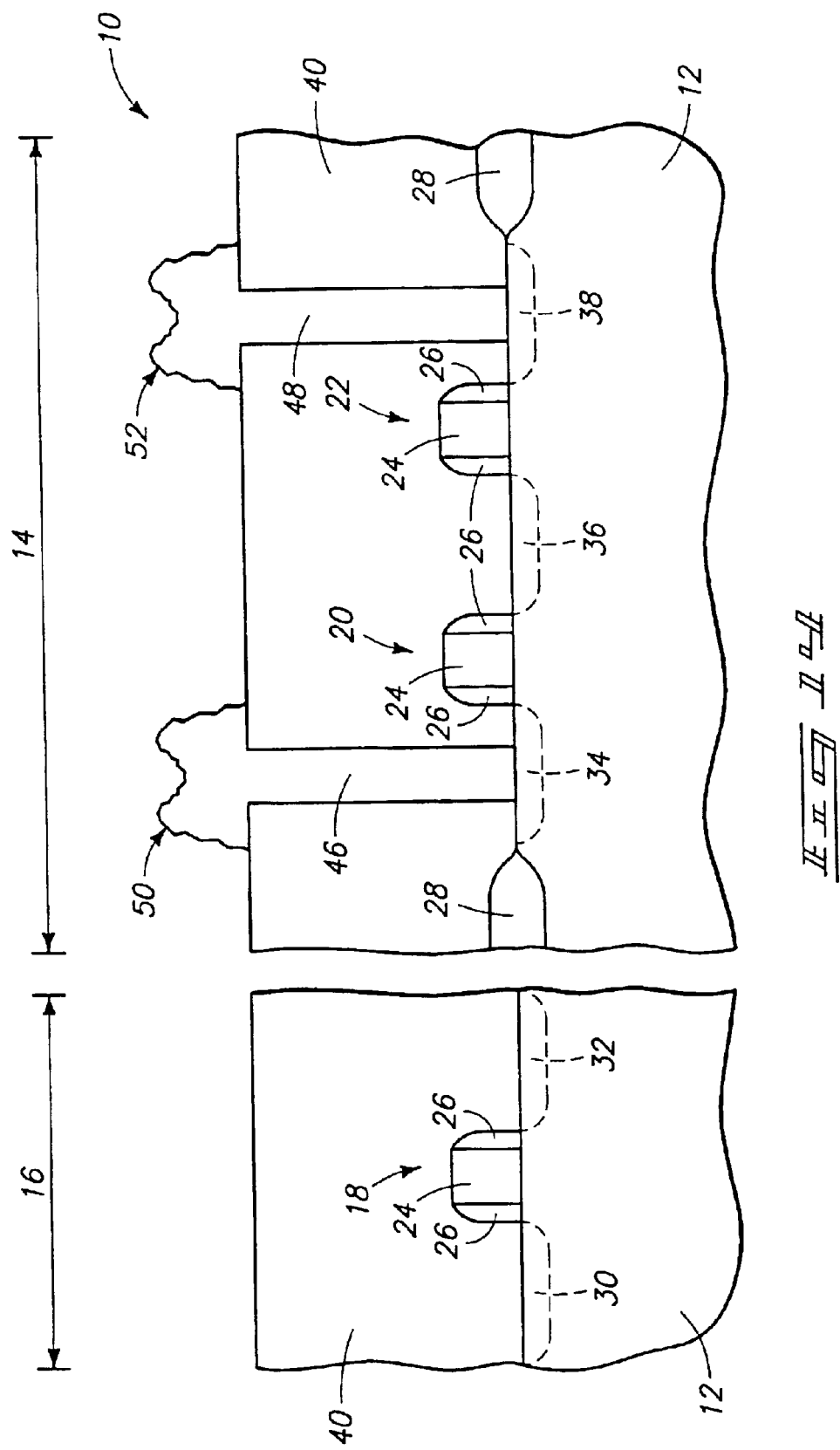
FIG. 14 is a view of a semiconductive wafer fragment shown at a processing step subsequent to that of FIG. 2 in accordance with a fifth embodiment method of the present invention.

Referring to FIG. 14, wafer fragment 10 is illustrated at a processing step subsequent to that of FIG. 2. Specifically, storage nodes 46 and 48 are formed within openings 42 and 44 (FIG. 2). Wafer fragment 10 of FIG. 14 differs from the wafer fragment 10 of FIG. 3 (which is also at processing step subsequent to that of FIG. 2) in that there is no dielectric layer 54 provided over storage nodes 46 and 48 in the embodiment of FIG. 14.

Figure 15:
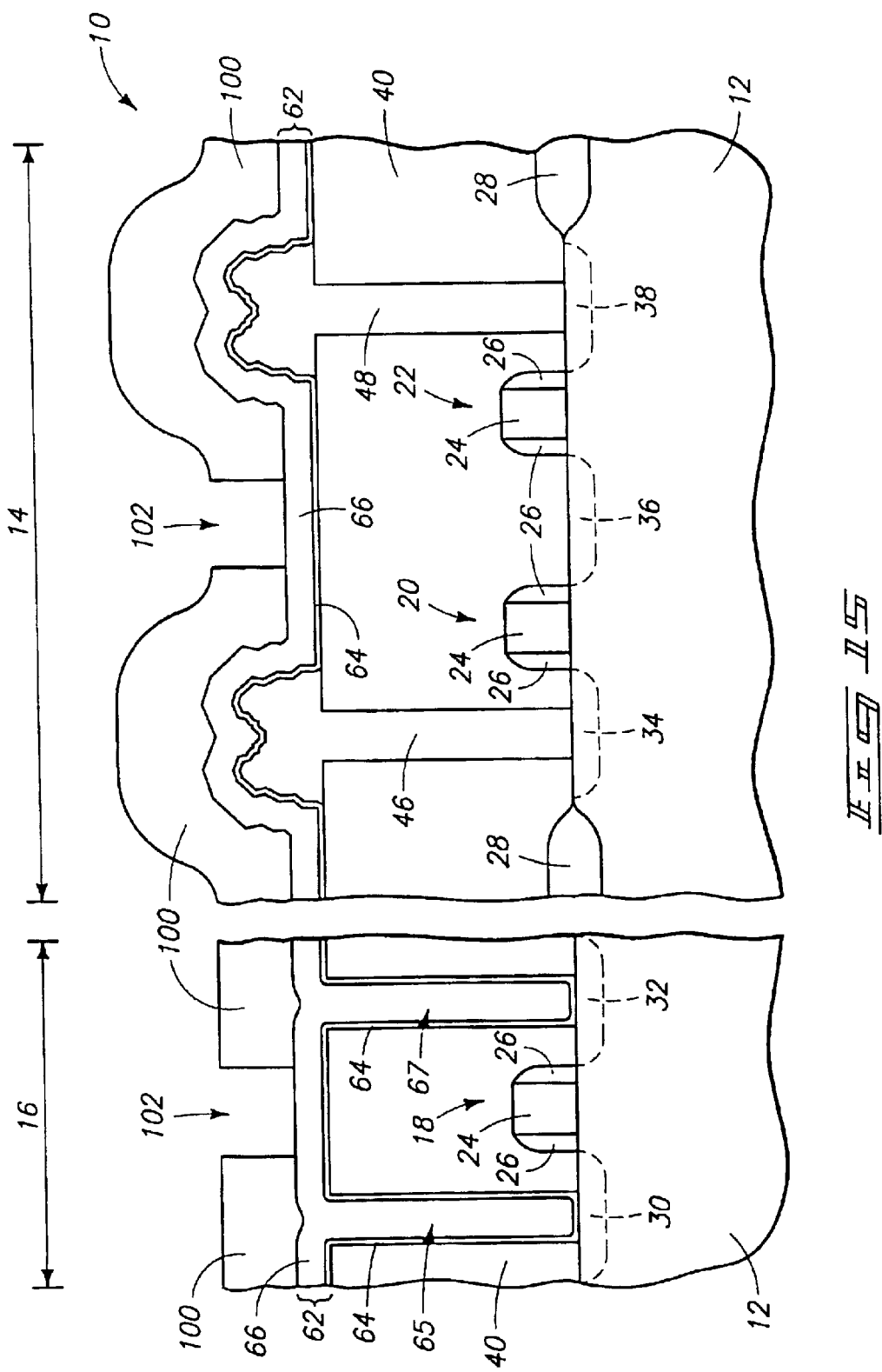
FIG. 15 is a view of the FIG. 14 wafer fragment shown at a processing step subsequent to that of FIG. 14.

FIG. 15 illustrates the wafer fragment 10 of FIG. 14 after it has been subjected to processing analogous to that described above with reference to FIGS. 4–6. Specifically, a conductive material 62 has been formed over storage nodes 46 and 48. Conductive material 62 has also been formed in electrical contact with node locations 32 to form electrical interconnects 65 and 67 over peripheral region 16 of substrate 12. As there was no dielectric layer formed prior to provision of conductive material 62, material 62 electrically interconnects with nodes 46 and 48 to effectively become a portion of the capacitor storage nodes 46 and 48.

A patterned photoresist layer 100 is provided over peripheral region 16 and memory array region 14. Patterned photoresist layer 100 has openings 102 extending through it.

Figure 16:
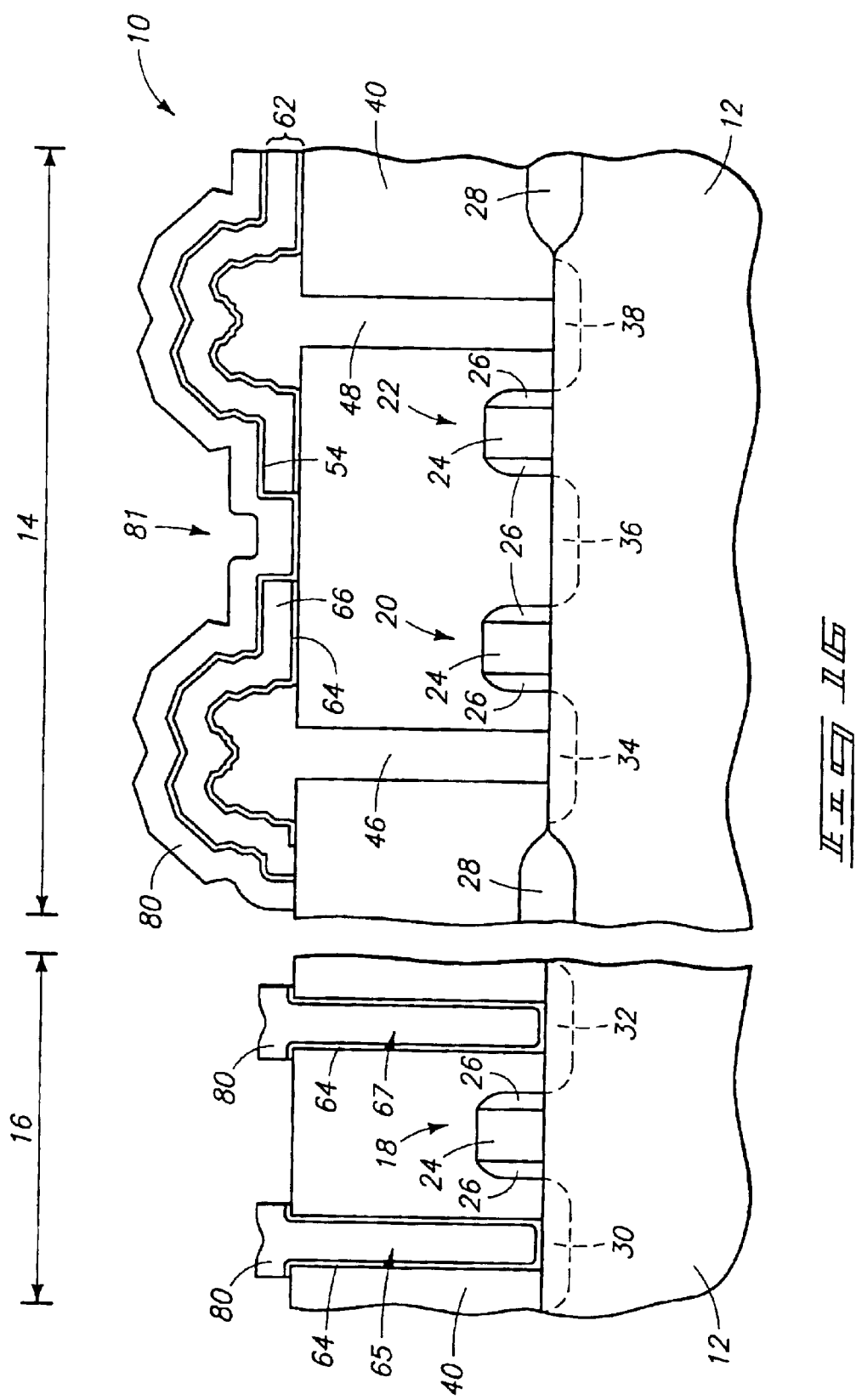
FIG. 16 is a view of the FIG. 14 wafer fragment shown at a processing step subsequent to that of FIG. 15.

Referring to FIG. 16, openings 102 (FIG. 15) are extended to electrically isolate electrical interconnects 65 and 67 from one another and from memory array region 14, as well as to electrically isolate storage nodes 46 and 48 from one another. Photoresist layer 100 (FIG. 15) is then removed, and a dielectric layer 54 is formed over memory array region 14. Dielectric layer 54 can be formed by, for example, processing described above with reference to FIG. 3. After formation of dielectric layer 54, a conductive layer 80 is provide over storage nodes 46 and 48, as well as over electrical interconnects 65 and 67. Conductive material 80 is then patterned to form a cell plate 81 over storage nodes 46 and 48, and to form electrically isolated contacts to interconnects 65 and 67. The formation and patterning of layer 80 can be conducted in accordance with the methods described above in reference to FIGS. 7 and 8.

The embodiment of FIGS. 14–16 forms a diffusion barrier layer 64 that is part of capacitor storage nodes 46 and 48. In the shown embodiment, material 62 can comprise diffusion barrier components throughout its thickness. Specifically, layers 64 and 66 can both comprise either titanium nitride or tungsten nitride.

It is noted that the embodiments described above form a diffusion barrier layer as either part of a storage node, or as a part of a capacitor plate. The invention encompasses other embodiments (not shown) wherein one or more of the above-described embodiments are combined to form a diffusion barrier region as part of a storage node and to also form a diffusion barrier region as part of a capacitor plate.

It is also noted that there will typically be a bit line contact (not shown) formed in electrical connection with node 36 in the embodiments described above to connect node 36 to a bit line (not shown). Such bit line can be either above the capacitors (a so-called capacitor over bit line construction) or beneath at least a portion of the capacitors (a so-called capacitor over bit line construction).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming circuitry comprising the following steps:
   providing a substrate, the substrate including a semiconductor material;
   defining a memory array region of the substrate and an other region of the substrate soaced from the memory array region; said other region comprising a conductively-doped region of the semiconductor material;
   forming a capacitor construction over the memory array region of the substrate, the capacitor construction comprising a pair of capacitor electrodes spaced from one another by at least a dielectric layer and a first barrier layer;
   forming an electrical interconnect over said other region of the substrate and in electrical connection with the conductively-doped region the electrical interconnect comprising a second barrier layer the conductively-doped region and a metal layer over the second barrier layer; and
   wherein the first and second barrier layers are formed in a same step.

2. The method of claim 1 wherein the first and second barrier layers comprise TiN.

3. The method of claim 1 wherein the first and second barrier layers comprise TiN, and wherein the same step comprises chemical vapor deposition.

4. The method of claim 1 wherein the first and second barrier layers comprise TiN, and wherein the metal layer comprises one or more of Ti, W, Al and Cu.

5. The method of claim 1 where the first and second barrier layers are together part of a common and continuous layer.

6. A method of forming circuitry, comprising:
   providing a substrate which comprises a semiconductive material;
   defining a memory array region of the substrate and an other region of the substrate spaced from the memory array region;
   providing a first electrical node associated with the memory array region of the substrate, and providing a second electrical node associated with said other region of the substrate;
   forming a first capacitor electrode in electrical connection with the first electrical node;
   in a common deposition step, forming a conductive material over the first capacitor electrode and in electrical connection with the second electrical node; and
   forming a capacitor dielectric layer and a second capacitor electrode ever the first capacitor electrode to form a capacitor construction comprising the capacitor dielectric layer and the first and second capacitor electrodes, one of the first and second capacitor electrodes comprising the conductive material.

7. The method of claim 6 comprising:
   forming an electrically conductive layer over the first capacitor electrode and over the second electrical node prior to the common deDesition step; xetching an opening through the wlectrically conductive layer to the second electrical node; and
   wherein the common deDosition steD forms the conductive matenal within the opening.

8. The method of claim 7 wherein the electrically conductive layer comprises at least one of TiN and WN.

9. The method of claim 7 wherein the electrically conductive layer comprises TiN.

10. The method of claim 7 further comprising forming the capacitor dielectric layer over the first capacitor electrode before forming the electrically conductive layer.

11. The method of claim 6 wherein the semiconductive material comprises monocrystalline silicon and the electrical nodes comprise electrically conductive diffusion regions formed within the semiconductive material.

12. The method of claim 6 wherein the forming the conductive material comprises forming a metal-comprising layer.

13. The method of claim 6 wherein the forming the conductive material comprises forming at least two layers.

14. The method of claim 6 wherein the forming the conductive material comprises forming at least three layers.

15. The method of claim 6, wherein the forming the conductive material comprises:
   forming a layer comprising TiN; and
   forming a second layer over the layer comprising TiN, the second layer not comprising TiN.

* * * * *

UNITED STATES PATENT AND TRADEMARK OFFICE
CERTIFICATE OF CORRECTION

PATENT NO. : 6,784,052 B2
DATED : August 31, 2004
INVENTOR(S) : Schuegraf et al.

It is certified that error appears in the above-identified patent and that said Letters Patent is hereby corrected as shown below:

Column 5,
Line 34, replace "photoresis:" with -- photoresist --.
Line 46, delete "to" after "describing".

Column 7,
Line 64, replace "provide" with -- provided --.
Line 52, replace "soaced" with -- spaced --.
Line 64, replace "region" with -- region, --.
Line 65, insert -- over -- after "layer".

Column 8,
Line 31, replace "ever" with -- over --.
Line 38, replace "deDeistion step; xetching;" with -- deposition step; etching --.
Line 39, replace "wlectrically" with -- electrically --.
Line 41, replace "deDeistion steD;" with -- deposition step --.
Line 42, replace "matenal" With -- material --.

Signed and Sealed this

Fifth Day of April, 2005

JON W. DUDAS
*Director of the United States Patent and Trademark Office*